United States Patent
Kim et al.

(10) Patent No.: US 9,627,233 B2
(45) Date of Patent: Apr. 18, 2017

(54) SUBSTRATE TREATING APPARATUS

(71) Applicant: Samsung Electronics Co., Ltd., Gyeonggi-do (KR)

(72) Inventors: SeokHoon Kim, Seongnam-si (KR); Yongmyung Jun, Hwaseong-si (KR); Yongsun Ko, Suwon-si (KR); Kyoungseob Kim, Suwon-si (KR); Jung-Min Oh, Incheon (KR); Kuntack Lee, Suwon-si (KR); Jihoon Jeong, Gurl-si (KR); Yong-Jhin Cho, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 69 days.

(21) Appl. No.: 14/187,556

(22) Filed: Feb. 24, 2014

(65) Prior Publication Data
US 2014/0291421 A1 Oct. 2, 2014

(30) Foreign Application Priority Data
Mar. 26, 2013 (KR) .......................... 10-2013-0032249

(51) Int. Cl.
B05B 1/14 (2006.01)
H01L 21/67 (2006.01)

(52) U.S. Cl.
CPC .... *H01L 21/6708* (2013.01); *H01L 21/67017* (2013.01); *H01L 21/67051* (2013.01)

(58) Field of Classification Search
CPC .................................................. H01L 21/6708
USPC .......................................................... 239/565
See application file for complete search history.

(56) References Cited

U.S. PATENT DOCUMENTS

| 5,479,845 | A | 1/1996 | Kawamura et al. |
| 5,494,526 | A * | 2/1996 | Paranjpe ........................... 134/1 |
| 6,334,266 | B1 * | 1/2002 | Moritz et al. ................... 34/337 |
| 7,225,820 | B2 | 6/2007 | Jones |
| 7,255,772 | B2 | 8/2007 | Biberger et al. |
| 7,650,907 | B2 * | 1/2010 | Goto ..................... F15B 11/044 137/625.69 |
| 7,682,462 | B2 | 3/2010 | Kroeker |
| 2004/0094183 | A1 * | 5/2004 | Ching et al. ................... 134/1.3 |

(Continued)

FOREIGN PATENT DOCUMENTS

| KR | 20-0379741 | 3/2005 |
| KR | 1020060070263 | 6/2006 |

(Continued)

*Primary Examiner* — Arthur O Hall
*Assistant Examiner* — Adam J Rogers
(74) *Attorney, Agent, or Firm* — Myers Bigel, P.A.

(57) ABSTRACT

Provided is a substrate treating apparatus including a housing; a plurality of opening-and-closing members configured to provide a driving force for opening and closing the housing; a fluid storing member supplying a fluid to the opening-and-closing members; and a fluid distribution unit connected to the fluid storing member via a supply conduit to distribute the fluid supplied from the fluid storing member to the opening-and-closing members. The fluid distribution unit includes a distribution conduit diverging from the supply conduit and connected to a corresponding one of the opening-and-closing members; and a fluid distribution member provided at a junction between the supply conduit and the distribution conduit.

19 Claims, 8 Drawing Sheets

(56) References Cited

U.S. PATENT DOCUMENTS

| | | | |
|---|---|---|---|
| 2006/0065287 A1* | 3/2006 | Kroeker | H01L 21/67126 134/2 |
| 2011/0240066 A1* | 10/2011 | Kamikawa | 134/26 |
| 2014/0238443 A1* | 8/2014 | Lee et al. | 134/21 |
| 2014/0327720 A1* | 11/2014 | Choy et al. | 347/47 |

FOREIGN PATENT DOCUMENTS

| | | |
|---|---|---|
| KR | 1020070011342 | 1/2007 |
| KR | 100801245 | 2/2008 |
| KR | 1020100072203 | 6/2010 |
| KR | 1020110080863 | 7/2011 |
| KR | 1020110080950 | 7/2011 |
| KR | 1020120095028 | 8/2012 |

* cited by examiner

SUBSTRATE TREATING APPARATUS

CROSS-REFERENCE TO RELATED APPLICATIONS

This U.S. non-provisional patent application claims priority under 35 U.S.C. §119 to Korean Patent Application No. 10-2013-0032249, filed on Mar. 26, 2013 in the Korean Intellectual Property Office, the entire contents of which are hereby incorporated by reference.

BACKGROUND OF THE INVENTION

To fabricate a semiconductor device or a liquid crystal display, a variety of processes, such as photolithography, etching, ashing, ion implantation, and film deposition processes, may be performed on or to a substrate. Each process is performed in a chamber.

The chamber may be configured to isolate an internal space from an outer space during the process. The chamber may be opened when the substrate is loaded therein or unloaded therefrom. The opening and closing of the chamber may be achieved using several hydraulic cylinders. For example, the chamber may be opened or closed depending on an amount of fluid to be supplied to the hydraulic cylinder.

SUMMARY

Example embodiments of the inventive concept relate to a substrate treating apparatus.

Example embodiments of the inventive concept provide a substrate treating apparatus configured to control operations of opening and closing the chamber.

According to example embodiments of the inventive concept, a substrate treating apparatus may include a housing; a plurality of opening-and-closing members configured to provide a driving force for opening and closing the housing; a fluid storing member supplying a fluid to the opening-and-closing members; and a fluid distribution unit connected to the fluid storing member via a supply conduit to distribute the fluid supplied from the fluid storing member to the opening-and-closing members, respectively. The fluid distribution unit comprises a distribution conduit diverging from the supply conduit and being connected to a corresponding one of the opening-and-closing members; and a fluid distribution member provided at a junction between the supply conduit and the distribution conduit.

According to other example embodiments of the inventive concept, a substrate treating apparatus may include a plurality of process chambers; a fluid storing member supplying a fluid that is used to provide a driving force for opening and closing the process chamber; and a fluid distribution unit connected to the fluid storing member via a supply conduit to distribute the fluid to an opening-and-closing member of each process chamber.

According to other example embodiments of the inventive concept, a substrate treating apparatus includes: a housing including a first housing portion and a second housing portion, with the second housing portion being movable relative to the first housing portion to open and close the housing; a plurality of cylinders connected to the second housing portion, the cylinders configured to move the second housing portion relative to the first housing portion; a fluid storing member configured to supply a fluid to the cylinders; and a fluid distribution unit connected to the fluid storing member via a supply conduit. The fluid distribution unit is configured to distribute the fluid supplied from the fluid storing member to the cylinders such that the second housing portion moves evenly relative to the first housing portion. The fluid distribution unit includes: a plurality of primary distribution conduits diverging from the supply conduit, with each primary distribution conduit in fluid communication with at least one of the cylinders; and a primary fluid distribution member provided at a first junction between the supply conduit and the plurality of primary distribution conduits.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, necessarily to scale and may not precisely reflect the precise structural or performance characteristics of any given embodiment, and should not be interpreted as defining or limiting the range of values or properties encompassed by example embodiments.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1:
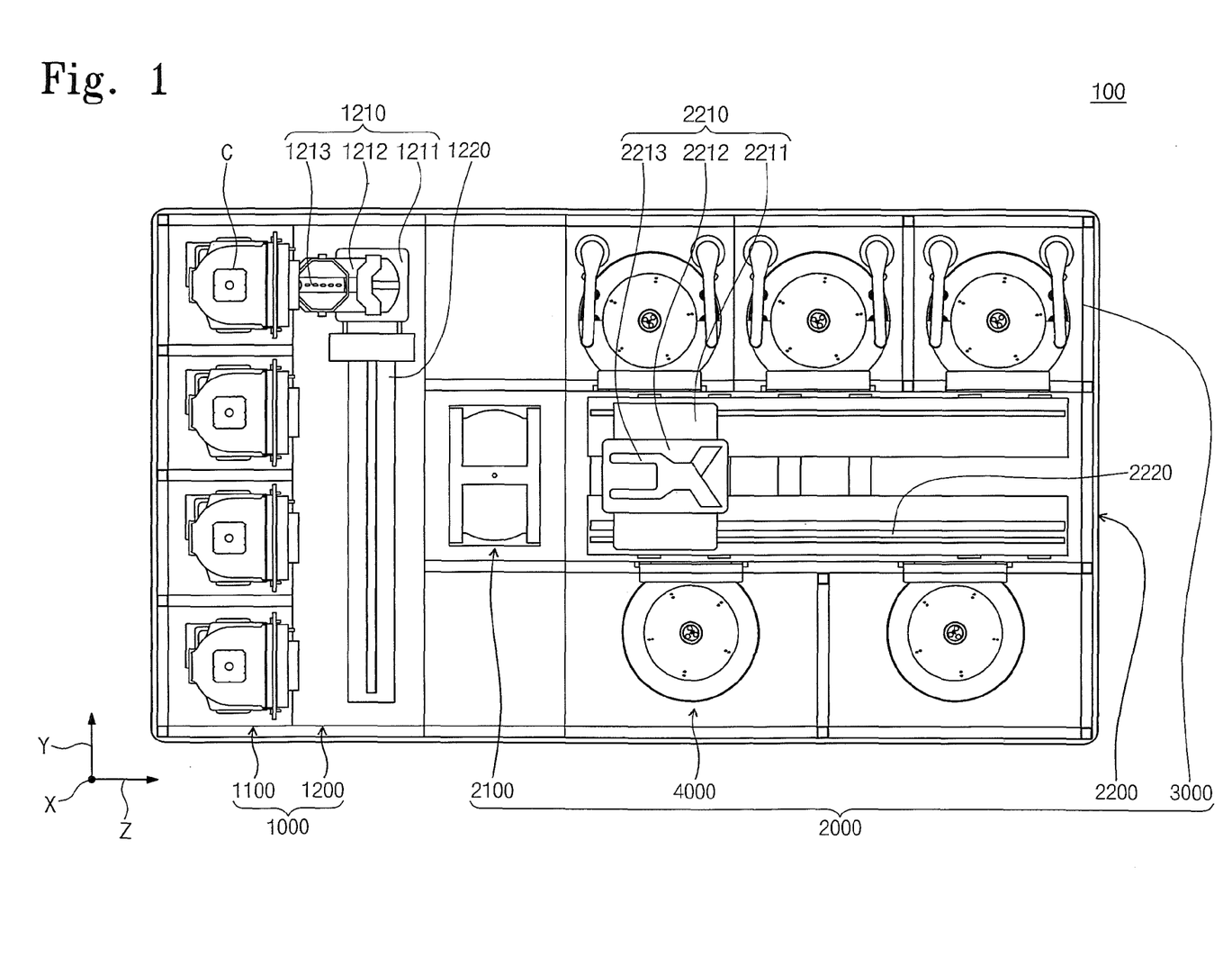
FIG. 1 is a plan view of a substrate treating apparatus including first and second process chambers according to exemplary embodiments of the inventive concept.

FIG. 1 is a plan view of a substrate treating apparatus according to exemplary embodiments of the inventive concept.

Referring to FIG. 1, a substrate treating apparatus 100 may include an index module 1000 and a process module 2000.

The index module 1000, which may be an equipment front-end module (EFEM), may include a rod port 1100 and a transfer frame 1200. The index module 1000 may be configured to receive a substrate S from the outside and send the substrate S to the process module 2000.

The rod port 1100, the transfer frame 1200, and the process module 2000 may be sequentially arranged in a row. For example, the rod port 1100, the transfer frame 1200, and the process module 2000 may be arranged along a first direction X. Hereinafter, a second direction Y will be used to represent a direction normal to the first direction X in top view, and a third direction Z will be used to represent a direction orthogonal to both of the first and second directions X and Y.

At least one rod port 1100 may be provided in the index module 1000. The rod port 1100 may be provided at a side of the transfer frame 1200. In the case where two or more rod ports 1100 are provided, the rod ports 1100 may be disposed in a column along the second direction Y. The number and disposition of the rod ports 1100 may not be limited to that shown in the illustrated embodiments and may be variously modified depending on footprint, process efficiency, or relative disposition with respect to other substrate treating apparatus of the substrate treating apparatus 100. A carrier C may be provided in the rod port 1100 to contain the substrate S. The carrier C may be loaded in the rod port 1100 from the outside or be unloaded from the rod port 1100 to the outside. For example, the carrier C may be transferred between the substrate treating apparatus 100 using a transfer device, such as an overhead hoist transfer (OHT) device. In certain embodiments, the transfer of the substrate S may be executed by other transfer devices, such as an automatic guided vehicle or a rail guided vehicle or an operator, and not by the overhead hoist transfer device.

The substrate S may be contained in the carrier C. The carrier C may be provided in a form of the front opening unified pod (FOUP). The carrier C may be configured to have at least one slot supporting an edge portion of the substrate S. In the case where two or more slots are provided, they may be formed spaced apart from each other along the third direction Z. Accordingly, the substrate S can be laid in the carrier C. In example embodiments, the carrier C may be configured to contain a plurality of substrates S (e.g., 25 substrates S). The carrier C may be configured in such a way that an internal space thereof is isolated from the outside using an openable door. This makes it possible to prevent the substrate S in the carrier C from being polluted.

The transfer frame 1200 may include an index robot 1210 and an index rail 1220. The transfer frame 1200 may be configured to allow the substrate S to be transferred between the carrier C to be laid on the rod port 1100 and the process module 2000.

The index rail 1220 may provide a path for movement of the index robot 1210. The index rail 1220 may be configured in such a way that its longitudinal direction is parallel to the second direction Y. The index robot 1210 may be configured to be able to unload the substrate S.

The index robot 1210 may include a base 1211, a body 1212, and an arm 1213. The base 1211 may be provided on the index rail 1220 to move along the index rail 1220. The body 1212 may be coupled to the base 1211 and be configured to move along the third direction Z or rotate about an axis parallel to the third direction Z, on the base 1211. The arm 1213 may be equipped on the body 1212 and be configured to be able to move forward and backward. A hand may be provided at an end portion of the arm 1213 to hold the substrate S. The index robot 1210 may include at least one arm 1213, and in the case where a plurality of the arms 1213 are provided, they may be stacked on the body 1212 along the third direction Z and they may be configured to be independently operated. Accordingly, in the index robot 1210, the base 1211 may move along the second direction Y on the index rail 1220, and the body 1212 and the arm 1213 may be operated to unload the substrate S from the carrier C and load it in the process module 2000 or to unload the substrate S from the process module 2000 and load it in the carrier C.

Further, the transfer frame 1200 may be configured without the index rail 1220, and the index robot 1210 may be fixed to the transfer frame 1200. In this case, the index robot 1210 may be provided at a center portion of the transfer frame 1200.

The process module 2000 may include a buffer chamber 2100, a transfer chamber 2200, a first process chamber 3000, and a second process chamber 4000. The process module 2000 may receive the substrate S from the index module 1000 and be configured to perform a cleaning process to the substrate S. The buffer chamber 2100 and the transfer chamber 2200 may be disposed along the first direction X, and the transfer chamber 2200 may be configured in such a way that a longitudinal direction thereof is parallel to the first direction X. The process chambers 3000 and 4000 may be provided at sides of the transfer chamber 2200 along the second direction Y. Here, the first process chamber 3000 may be disposed at one side of the transfer chamber 2200 in the second direction Y, and the second process chamber 4000 may be disposed at the other side of the transfer chamber 2200 facing the first process chamber 3000. The number of the first process chamber 3000 may be one or more, and in the case where a plurality of first process chambers 3000 are provided, they may be disposed at a side of the transfer chamber 2200 along the first direction X, be stacked along the third direction Z, or two-dimensionally arranged along the first and third directions X and Z. The number of the second process chamber 4000 may also be one or more. A plurality of second process chamber 4000 may be disposed at the other side of the transfer chamber 2200 along the first direction X, be stacked along the third direction Z, or two-dimensionally arranged along the first and third directions X and Z.

However, in the process module 2000, the disposition of the chambers 2100, 2200, 3000, and 4000 is not be limited to the above-described examples and may be suitably modified in consideration of process efficiency. For example, the first process chamber 3000 and the second process chamber 4000 may be disposed along the first direction X or be stacked one on another, e.g., at the same side of the transfer chamber 2200.

The buffer chamber 2100 may be provided between the transfer frame 1200 and the transfer chamber 2200. The buffer chamber 2100 may provide a buffer space allowing the substrate S to be temporarily loaded before the transfer between the index module 1000 and the process module 2000. The buffer chamber 2100 may be configured to have at least one buffer slot, in which the substrate S is laid. In the case where a plurality of buffer slots are provided, they may be spaced apart from each other along the third direction Z. The buffer slot may be configured to contain the substrate S that is unloaded from the carrier C by the index robot 1210 or from the process chambers 3000 and 4000 by a transfer robot 2210 of the transfer chamber 2200. Further, the index robot 1210 or the transfer robot 2210 may be configured to unload the substrate S from the buffer slot and then contain it in the carrier C or move it into the process chambers 3000 and 4000.

The transfer chamber 2200 may be configured to transfer the substrate S between the chambers 2100, 3000, and 4000 disposed adjacent thereto. The buffer chamber 2100 may be disposed at a side of the transfer chamber 2200 in the first direction X, and the process chambers 3000 and 4000 may be disposed at one or both sides of the transfer chamber 2200 in the second direction Y. Accordingly, the transfer chamber 2200 may allow the substrate S to be transferred between the buffer chamber 2100, the first process chamber 3000 and the second process chamber 4000. The transfer chamber 2200 may include a transfer rail 2220 and the transfer robot 2210.

The transfer rail 2220 may be configured to provide a path for the movement of the transfer robot 2210. The transfer rail 2220 may be provided parallel to the first direction X. The transfer robot 2210 may be configured to be able to transfer the substrate S. The transfer robot 2210 may include a base 2211, a body 2212, and an arm 2213. Each of the components of the transfer robot 2210 may be configured to have the technical features similar to the index robot 1210, and thus, for the sake of simplicity, the detailed description thereto will be omitted below. In the transfer robot 2210, the base 2211 may move along the transfer rail 2220 and the body 2212 and the arm 2213 may be operated to transfer the substrate S between the buffer chamber 2100, the first process chamber 3000, and the second process chamber 4000.

The first process chamber 3000 and the second process chamber 4000 may be configured to perform different processes to the substrate S. Here, first and second processes may be performed in the first and second process chambers 3000 and 4000, respectively, and may be sequentially performed. For example, a chemical process, a rinse process, and a first drying process may be performed in the first process chamber 3000, and then, a second drying process may be performed in the second process chamber 4000. Here, the first drying process may be a wet drying process using an organic solvent, and the second drying process may be a supercritical drying process using a supercritical fluid. In certain embodiments, one of the first drying process and the second drying process may be selectively performed.

Figure 2:
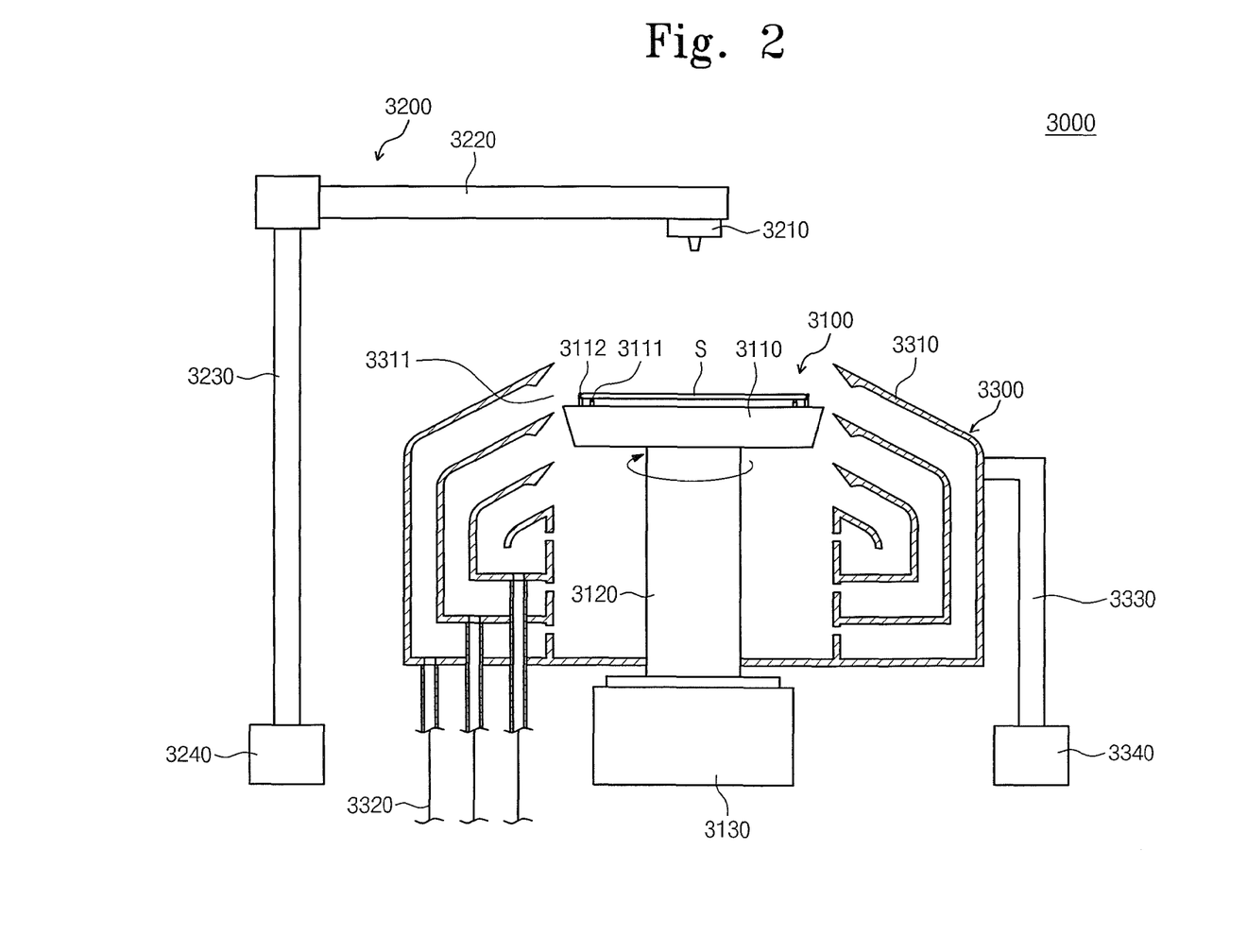
FIG. 2 is a sectional view of the first process chamber of FIG. 1.

FIG. 2 is a sectional view of the first process chamber of FIG. 1.

Referring to FIG. 2, the first process chamber 3000 may include a supporting member 3100, a nozzle member 3200 and a recovery member 3300.

The supporting member 3100 may be configured to support and rotate the substrate S. The supporting member 3100 may include a supporting plate 3110, a supporting pin 3111, a chucking pin 3112, a rotating axis or member 3120, and a rotating actuator 3130.

The supporting plate 3110 may have a top surface, whose shape is identical or similar to that of the substrate S, and the supporting pin 3111 and the chucking pin 3112 may be provided on the top surface of the supporting plate 3110. The supporting pin 3111 may be configured to support the substrate S, and the chucking pin 3112 may be configured to fix the supported substrate S (e.g., fix the substrate S in place).

The rotating member 3120 may be connected to a bottom portion of the supporting plate 3110. The rotating actuator 3130 may be configured to rotate the supporting plate 3110 about an axis defined by the rotating member 3120. Accordingly, the substrate S may be rotated on and along with the supporting plate 3110. Here, the chucking pin 3112 may prevent the substrate S from being deviated from the normal position thereof.

The nozzle member 3200 may be configured to inject chemicals onto the substrate S. The nozzle member 3200 may include a nozzle 3210, a nozzle bar 3220, a nozzle member defining an axis 3230, and a nozzle axis actuator 3240.

The nozzle 3210 may inject chemicals onto the substrate S loaded on the supporting plate 3110. The chemicals may be at least one of cleaning agent, rinse agent, or organic solvent. In example embodiments, the cleaning agent may include hydrogen peroxide ($H_2O_2$) solution, hydrogen peroxide solution added with ammonia ($NH_4OH$), hydrochloric acid (HCl) or sulfuric acid ($H_2SO_4$), or hydrofluoric acid (HF) solution. The rinse agent may be de-ionized water. The organic solvent may be at least one of solution or gas of isopropyl alcohol, ethyl glycol, 1-propanol, tetra hydraulic franc, 4-hydroxyl, 4-methyl, 2-pentanone, 1-butanol, 2-butanol, methanol, ethanol, n-propyl alcohol, or dimethyl ethyl.

The nozzle 3210 may be provided at a bottom surface of an end portion of the nozzle bar 3220. The nozzle bar 3220 may be connected to the nozzle axis member 3230, and thus, the nozzle bar 3220 may elevate or rotate the nozzle axis member 3230. The nozzle axis actuator 3240 may elevate or rotate the nozzle axis member 3230 to adjust a position of the nozzle 3210.

The recovery member 3300 may be configured to retrieve the chemicals to be provided onto the substrate S. When the chemicals are provided onto the substrate S through the nozzle member 3200, the supporting member 3100 may rotate the substrate S, and thus, the chemicals may be uniformly provided onto the whole region of the substrate S. The recovery member 3300 may be configured to retrieve flying portions of the chemicals, which may occur when the substrate S is rotated.

The recovery member 3300 may include a recovery barrel 3310, a recovery conduit 3320, an elevation bar 3330, and an elevation actuator 3340.

The recovery barrel 3310 may be provided in the form of a ring enclosing the supporting plate 3110 (e.g., enclosing side portions of the supporting plate 3110). There may be one or more recovery barrels 3310. In the case where a plurality of the recovery barrels 3310 are provided, the recovery barrels 3310 may be configured to have diameters and heights increasing with increasing distance from the supporting plate 3110 and each of them may be shaped like a ring, in plan view. Accordingly, a recovery hole, opening or passageway 3311 may be formed between the recovery barrels 3310 (e.g., between adjacent recovery barrels 3310) to collect the chemicals that fly from the substrate S.

The recovery conduit 3320 may be provided on a bottom surface of the recovery barrel 3310. The recovery conduit 3320 may be configured to supply the chemical from the recovery barrel 3310 to a chemical-renewing system, for example.

The elevation bar 3330 may be connected to the recovery barrel 3310 to move the recovery barrel 3310 vertically using power (e.g., a mechanical power) provided from the elevation actuator 3340. In the case where the number of the recovery barrels 3310 is two or more, the elevation bar 3330 may be connected to the outermost one of the recovery barrels 3310. The elevation actuator 3340 may adjust a vertical position of the recovery barrel 3310 using the elevation bar 3330, and this makes it possible to allow a selected one of the recovery holes 3311 to collect (e.g., mainly collect) the flying chemicals.

Figure 3:
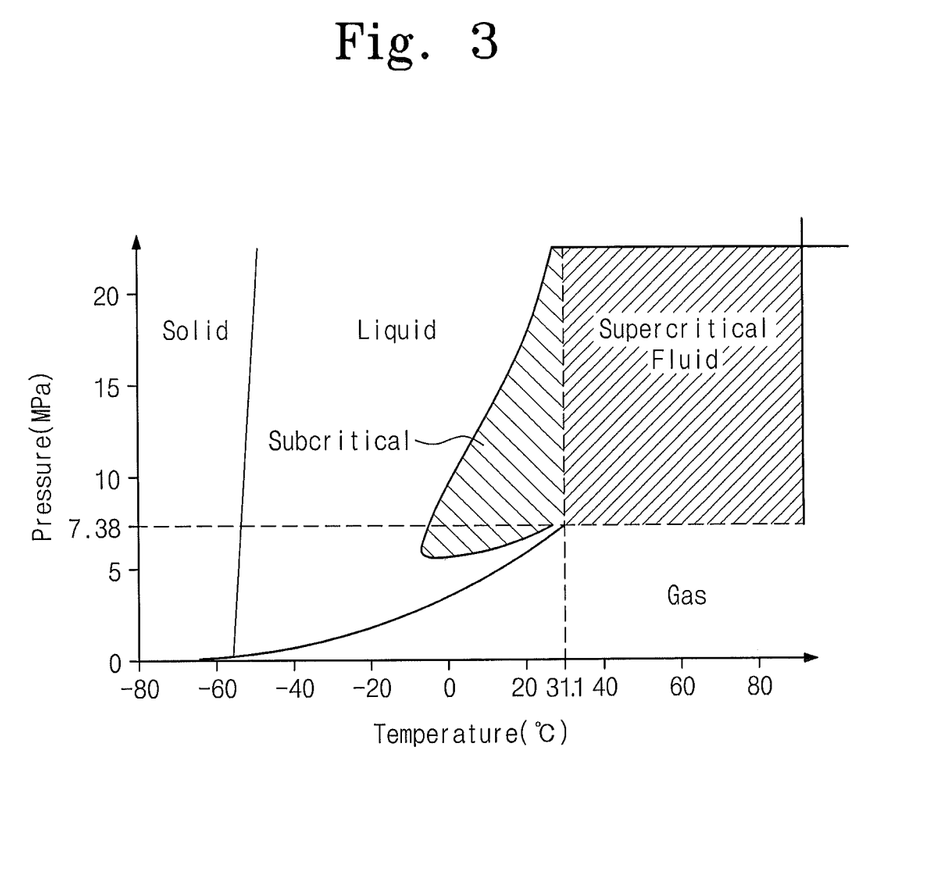
FIG. 3 is a phase diagram of carbon dioxide.

FIG. 3 is a phase diagram of carbon dioxide.

The supercritical fluid will be described with reference to FIG. 3.

The supercritical fluid is any substance at a temperature and pressure above its critical point, where distinct liquid and gas phases do not exist. The supercritical fluid may exhibit a molecular density similar to that of liquid and a viscosity similar to that of air. Since the supercritical fluid may exhibit excellent properties relevant to diffusion, permeation, and dissolution, it may be advantageous for chemical reactions. Further, since the supercritical fluid has a very low surface tension, the use of the supercritical fluid makes it possible to efficiently perform a process of drying a semiconductor device, while inhibiting or preventing micro-sized patterns of the semiconductor device from falling or being damaged.

Hereinafter, the use of supercritical carbon dioxide (CO2) fluid for drying the substrate S will be described, but the composition and kind of the supercritical fluid may not be limited thereto.

The carbon dioxide is in a supercritical state at a temperature of 31.1° C. or higher and a pressure of 7.38 Mpa or higher. The carbon dioxide exhibits non-toxic, nonflammable, and non-active properties, and the supercritical carbon dioxide has a lower critical temperature and a lower critical pressure compared with other fluids. Accordingly, solvency of the supercritical carbon dioxide can be easily controlled by adjusting temperature and pressure. Further, the supercritical carbon dioxide exhibits advantageous physical properties for a drying process (for example, a low diffusion coefficient, e.g., by 10 or 100 times, and a very small surface tension, compared with water or other organic solvents). Further, the carbon dioxide may be obtained by recycling side products of various chemical reactions and be re-used by recycling the supercritical carbon dioxide used for the drying process. Accordingly, the use of the carbon dioxide makes it possible to realize an environment-friendly process.

Figure 4:
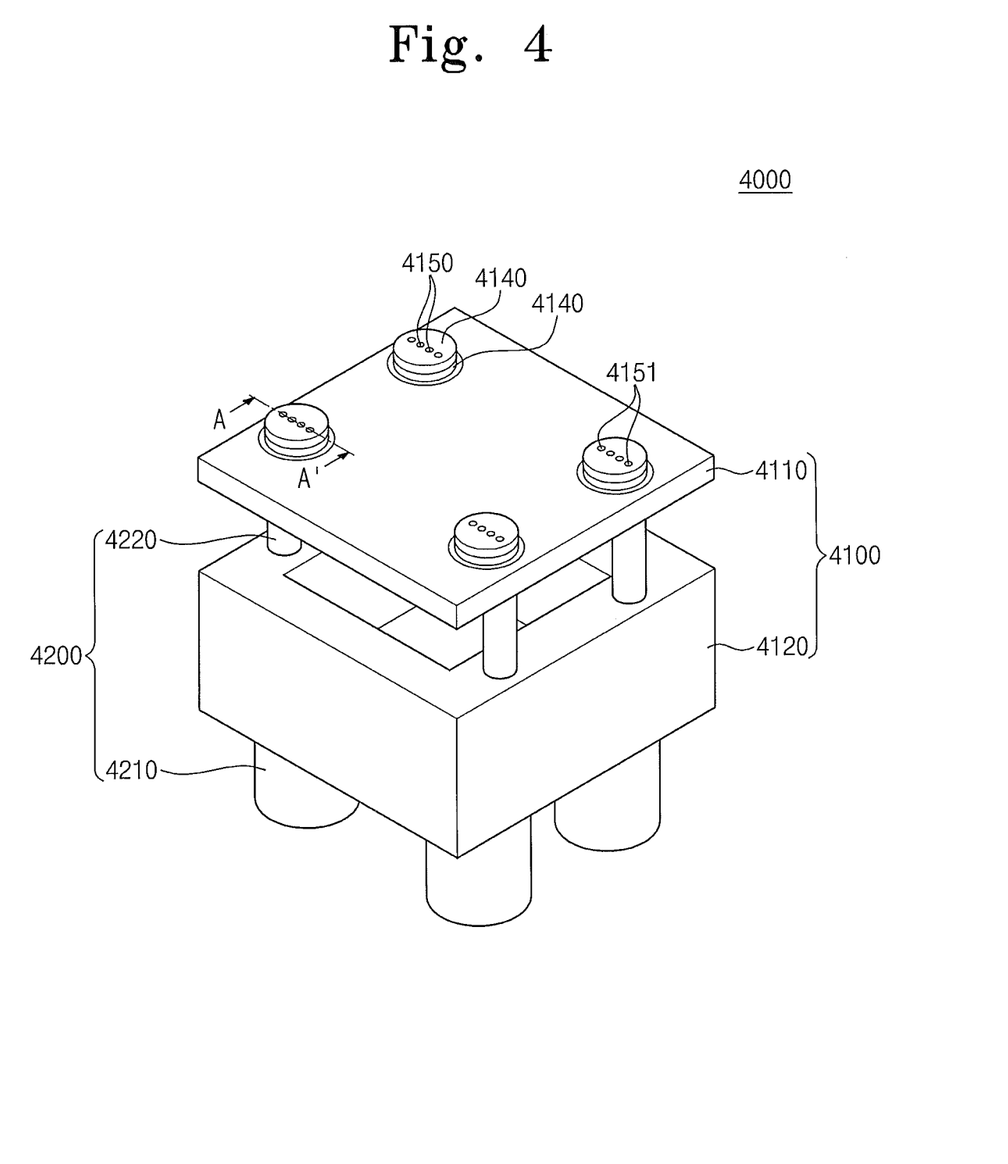
FIG. 4 is a perspective view of the second process chamber of FIG. 1.
Figure 5:
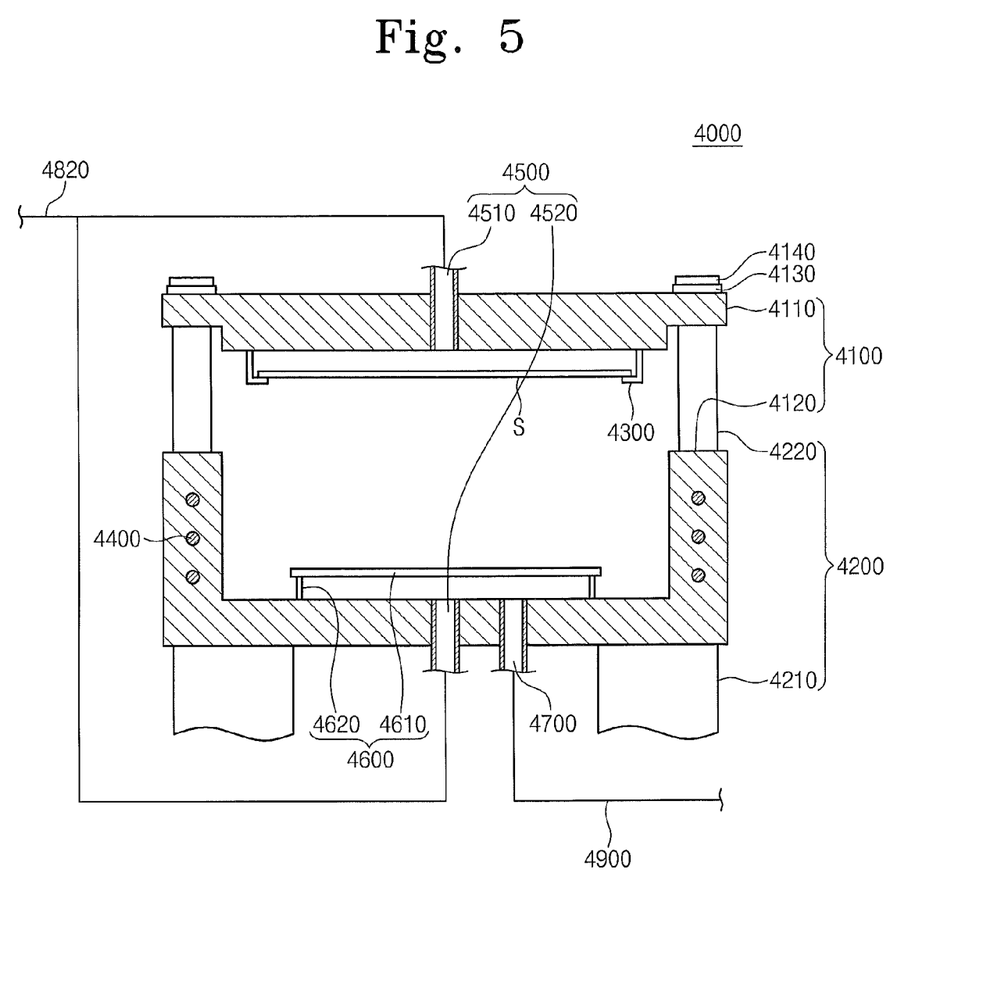
FIG. 5 is a sectional view of the second process chamber of FIG. 1.

FIG. 4 is a perspective view of the second process chamber of FIG. 1, and FIG. 5 is a sectional view of the second process chamber of FIG. 1.

Referring to FIGS. 4 and 5, the second process chamber 4000 may include a housing 4100, an opening-and-closing member 4200, a supporting member 4300, a heating member 4400, a supplying port 4500, a blocking member 4600, and an exhausting port 4700.

The second process chamber 4000 may be configured to execute a supercritical drying process using supercritical fluid. Further, the process to be performed in the second process chamber 4000 may be another supercritical process that is different from the supercritical drying process. The housing 4100 may be configured to provide a room or space (e.g., internal cavity or volume) for performing the supercritical drying process. The housing 4100 may be configured to endure a high pressure that is higher than the critical pressure.

The housing 4100 may include a first housing or first housing portion 4110 and a second housing or second housing portion 4120. The housing 4100 may provide a room or space for treating the substrate with the supercritical fluid (e.g., internal cavity or volume). The second housing 4120 may be configured to be able to be moved relative to the first housing 4110. For example, the first housing 4110 may be fixed, while the second housing 4120 may be configured to move vertically. If the second housing 4120 is moved downward to be spaced apart from the first housing 4110, an internal space of the second process chamber 4000 may be opened, and thus, the substrate S can be loaded to or unloaded from the internal space of the second process chamber 4000. In the case where the substrate S is loaded in the second process chamber 4000 after the organic solvent process in the first process chamber 3000, the organic solvent may remain on the substrate S. Further, if the second housing 4120 is moved upward to contact the first housing 4110 (e.g., be closely adhered to the first housing 4110), the internal space of the second process chamber 4000 may be sealed to allow the supercritical drying process to be performed therein. In example embodiments, the second housing 4120 may be fixed, while the first housing 4110 may be configured to be moved vertically.

The opening-and-closing member 4200 may provide power (e.g., a mechanical power) allowing the housing 4100 to be opened or closed. In example embodiments, the number of the opening-and-closing members 4200 may be one or more. For example, in the case where the housing 4100 is shaped like a rectangle in top view, the opening-and-closing members 4200 may be provided near corners of the housing 4100. In other embodiments, in the case where the housing 4100 is shaped like a circle in top view, the opening-and-closing members 4200 may be provided to have symmetry with respect to a center of the housing 4100. This makes it possible to equalize mechanical forces to be exerted between the opening-and-closing members 4200 and the housing 4100. For the sake of simplicity, the description that follows will refer to an example embodiment in which the first housing 4110 is fixed and the opening-and-closing member 4200 is configured to vertically move the second housing 4120. The opening-and-closing member 4200 may include a cylinder 4210 and a rod 4220. The cylinder 4210 may be connected to an outer surface of the second housing 4120 to transfer a driving force for moving the second housing 4120. During the supercritical drying process, the cylinder 4210 may be configured to apply a driving force between the first housing 4110 and the second housing 4120. In example embodiments, the driving force exerted through the cylinder 4210 may have a magnitude capable of overcoming the critical pressure to be formed in the internal space of the second process chamber 4000 during the supercritical drying process, and thus, the second process chamber 4000 can be sealed by the driving force. An end portion of the rod 4220 may be connected to the cylinder 4210 in such a way that it can be moved relative to the cylinder 4210. The other end portion of the rod 4220 may be connected to the first housing 4110. A portion of the rod 4220 may be inserted into the second housing 4120 in such a way that it can slide through the second housing 4120. As the result of this structure, if the driving force is applied to the cylinder 4210, the cylinder 4210 may be moved relative to the rod 4220 to allow the second housing 4120 connected to the cylinder 4210 to be moved. The rod 4220 may guide the relative movement of the first housing 4210 or the second housing 4220 and prevent the first housing 4110 and the second housing 4120 from deviating from the desired relative position thereof.

The supporting member 4300 may be configured to support the substrate S between the first housing 4110 and the second housing 4120. The supporting member 4300 may include a vertical portion vertically extending downwardly from a bottom surface of the first housing 4110 and another portion extending laterally from the bottom end of the vertical portion toward the center of the first housing 4110. Accordingly, the supporting member 4300 may support an edge portion of the substrate S. Since the supporting member 4300 is in contact with the edge portion of the substrate S, it is possible to perform the supercritical drying process to the whole top surface and a substantial region of the bottom surface of the substrate S (e.g., most of the bottom surface of the substrate S). In example embodiments, the substrate S may have a top surface provided with patterns and a bottom surface, on which a pattern is not provided. Further, due to the presence of the fixed first housing 4110, the supporting member 4300 can support the substrate S with relatively increased stability, e.g., during the time second housing 4120 is moved vertically. In other embodiments, the supporting member 4300 may be provided in the second housing 4120.

The heating member 4400 may be configured to heat an internal space of the second process chamber 4000. Owing to the presence of the heating member 4400, it is possible to heat the supercritical fluid supplied in the second process chamber 4000 over the critical temperature thereof and thereby maintain the supercritical phase. In addition, in the case where the fluid is liquefied, the fluid may be re-heated by the heating member 4400 to have the supercritical phase. The heating member 4400 may be buried or embedded in a wall of at least one of the first housing 4110 or the second housing 4120. In example embodiments, the heating member 4400 may be configured to generate heat using an electric power supplied from the outside or to serve as a heater.

The supplying port 4500 may be configured to supply the supercritical fluid into the second process chamber 4000 (e.g., via conduit 4820). The supplying port 4500 may include an upper supplying port 4510 and a lower supplying port 4520. The upper supplying port 4510 may be provided in the first housing 4110 to supply the supercritical fluid onto the top surface of the substrate S supported by the supporting member 4300. The lower supplying port 4520 may be provided in the second housing 4120 to supply the supercritical fluid onto the bottom surface of the substrate S supported by the supporting member 4300.

The supplying ports 4500 may be configured to spray the supercritical fluid to the central region of the substrate S. For example, the upper supplying port 4510 may be located on or above the center of the substrate S supported by the supporting member 4300. Further, the lower supplying port 4520 may be located below the center of the substrate S supported by the supporting member 4300. Accordingly, the supercritical fluid sprayed from the supplying port 4500 may be supplied to the central region of the substrate S and be spread toward the edge portion of the substrate S, thereby covering the whole region of the substrate S in a uniform fashion.

In the upper supplying port 4510 and the lower supplying port 4520, the supercritical fluid may be supplied through the lower supplying port 4520 and then be supplied through the upper supplying port 4510. At an initial stage of the supercritical drying process, the internal space of the second process chamber 4000 may have a pressure lower than the critical pressure, and in this case, the supercritical fluid may be liquefied in the second process chamber 4000. As a result, in the case where the supercritical fluid is supplied into the upper supplying port 4510 at the initial stage of the supercritical drying process, the liquefied fluid may fall gravitationally to the substrate S, thereby causing a damage of the substrate S. After the second process chamber 4000 has an internal pressure that is higher than the critical pressure, the upper supplying port 4510 may start to supply the supercritical fluid into the second process chamber 4000, and this method can prevent the liquefied fluid from being dropped onto the substrate S.

The blocking member 4600 may prevent the supercritical fluid supplied from the supplying port 4500 from being directly sprayed onto the substrate S. The blocking member 4600 may include a blocking plate 4610 and a supporting part 4620.

The blocking plate 4610 may be provided between the supplying port 4500 and the substrate S supported by the supporting member 4300. For example, the blocking plate 4610 may be provided between the lower supplying port 4520 and the supporting member 4300 or below the substrate S. The blocking plate 4610 may prevent the supercritical fluid supplied from the lower supplying port 4520 from being sprayed directly onto the bottom surface of the substrate S.

The blocking plate 4610 may be provided in such a way that a diameter thereof is equivalent to or greater than that of the substrate S. In this case, the blocking plate 4610 may prevent the supercritical fluid from being sprayed directly on the substrate S. In other embodiments, the blocking plate 4610 may be provided in such a way that a diameter thereof is smaller than that of the substrate S. In this case, it is possible to prevent the supercritical fluid from being sprayed directly onto the substrate S and decrease a speed of the supercritical fluid, and thus, the supercritical fluid can reach the substrate S. In other words, it is possible to efficiently perform the supercritical drying process on the substrate S.

The supporting part 4620 may support the blocking plate 4610. In other words, the blocking plate 4610 may be laid on an end portion of the supporting part 4620. The supporting part 4620 may extend vertically upwardly from the bottom surface of the housing 4100. The supporting part 4620 and the blocking plate 4610 may be equipped in such a way that the blocking plate 4610 is laid on the supporting part 4620 by gravitational force without the use of an additional connecting element. In the case where the supporting part 4620 and the blocking plate 4610 are connected to each other using a connecting element, such as nut or bolt, a pollutant substance resulting from the supercritical fluid may be produced therebetween. In example embodiments, the supporting part 4620 and the blocking plate 4610 may be provided to form a single body. Alternatively, the blocking member 4600 may be omitted.

In the case where, at the initial stage of the supercritical drying process, the supercritical fluid may be supplied through the lower supplying port 4520, due to a low internal pressure of the housing 4100, the supercritical fluid may be injected with a high speed. If the supercritical fluid of high speed is directly injected on the substrate S, a portion of the substrate S may become bent, due to the physical pressure from the supercritical fluid. In other words, a leaning phenomenon may happen. Further, the injecting force of the supercritical fluid may result in a vibration of the substrate S, and thus, the organic solvent remaining on the substrate S may flow, thereby causing damage on the circuit patterns, which may be formed on the substrate S.

Thus, the blocking plate 4610 provided between the lower supplying port 4520 and the supporting member 4300 may be configured to prevent the supercritical fluid from being directly injected or sprayed onto the substrate S, and thus, it is possible to prevent the substrate S from being damaged by the physical force exerted from the supercritical fluid.

The exhausting port 4700 may be configured to exhaust the supercritical fluid from the second process chamber 4000 (e.g., via the conduit 4900).

The exhausting port 4700 may be formed through the second housing 4120. At a final state of the supercritical drying process, the supercritical fluid may be discharged from the second process chamber 4000, and thus, the internal pressure of the second process chamber 4000 may be lowered below the critical pressure of the fluid and the fluid may be liquefied. The liquefied fluid may be discharged through the exhausting port 4700 by gravitational force.

Figure 6:
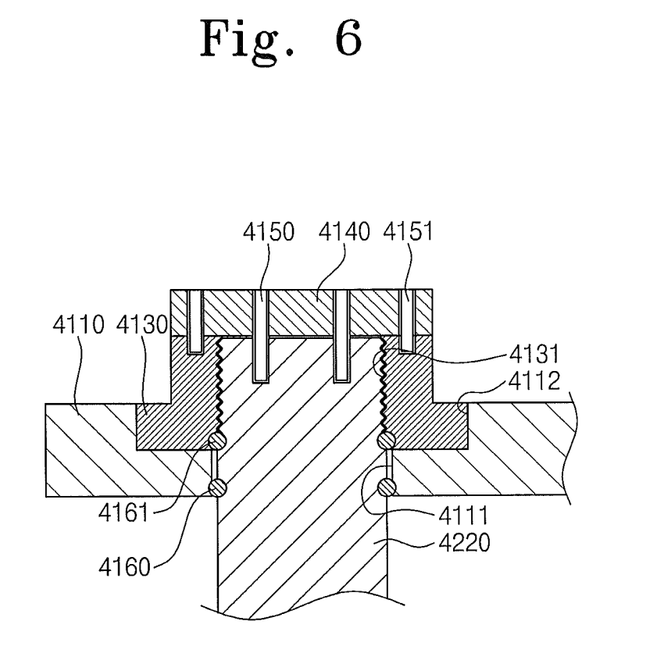
FIG. 6 is a sectional view taken along line A-A' of FIG. 4.

FIG. 6 is a sectional view taken along line A-A' of FIG. 4.

Referring to FIG. 6, the rod 4220 may have an end portion fastened to the first housing 4110.

The first housing 4110 may have a hole, opening or passageway 4111 formed to correspond to an outer circumference of the rod 4220. The end portion of the rod 4220 may be inserted into and fastened to the hole 4111. A fixing member 4130 may be provided on an outer surface of the first housing 4110 and at a position corresponding to the hole 4111. The fixing member 4130 may be provided in the form of a nut. The fixing member 4130 may be fastened to the outer surface of the first housing 4110. For example, the first housing 4110 may be provided to have a concave stepped portion 4112 at a position corresponding to the hole 4111. The fixing member 4130 may be inserted into the stepped portion 4112 and be coupled to the first housing 4110. The fixing member 4130 may be coupled to the first housing 4110 using a welding process. Further, the fixing member 4130 may be fastened to the first housing 4110 using, for example, a bolt. A fastening hole, opening or passageway 4131 formed in the fixing member 4130 may be aligned with the hole 4111 of the first housing 4110. The fastening hole 4131 and an end portion of the rod 4220 may be provided to have threads that are fittingly engaged to each other and be formed to correspond to each other (e.g., threadingly engaged).

A connection member 4140 may be provided on a upper surface of the fixing member 4130. The connection member 4140 may be configured in such a way that the fixing member 4130 is closely engaged to the end portion of the rod 4220. For example, the end portion of the rod 4220 may be inserted into the hole 4111 and the fastening hole 4131, and the end of the rod 4220 may be coplanar with an outer surface of the fixing member 4130. The connection member 4140 may be fastened to the outer surface of the fixing member 4130, on which the fastening hole 4131 is formed, and the end of the rod 4220. For example, the connection member 4140 may be welded to the fixing member 4130 using a welding process. The connection member 4140 and the end portion of the rod 4220 may be connected to each other by a first fixing bar 4150, which may be inserted from an outer surface of the connection member 4140 into the rod 4220. Further, the connection member 4140 and the fixing member 4130 may be connected to each other using a second fixing bar 4151 and a welding process or be connected to each other using only the second fixing bar 4151, without the use of the welding process.

When the housing 4200 is opened or closed, a moment may be exerted on or to the rod 4220. In the case where the rod 4220 is rotated by the moment, particles may be produced from contact regions between the fixing member 4130 or first housing 4110 and the rod 4220. The connection member 4140 may be provided to reduce the chance of particles being produced by the rotation of the rod 4220.

A first sealing or first sealing member 4160 may be provided between the rod 4220 and the first housing 4110. The first sealing 4160 may be provided at a region of the hole that is positioned adjacent to the internal space of the housing 4200. A second sealing or second sealing member 4161 may be provided between the rod 4220 and the fastening hole 4131. The second sealing 4161 may be provided at a region of the fastening hole 4131 that is positioned adjacent to the internal space of the housing 4200. The first and second sealings 4160 and 4161 may prevent particles, which may be produced by a small rotation of the rod 4220, from flowing into the housing 4200.

In still other embodiments, the fixing member 4130 may be omitted. Here, the hole of the first housing 4110 and an end portion of the rod 4220 may be provided to have threads that are fittingly engaged to each other and be formed to correspond to each other. Alternatively, the first housing 4110 and the rod 4220 may not have such threads. The connection member 4140 may be connected to the outer surface of the first housing 4110 and the end of the rod 4220.

In still other embodiments, the first sealing 4160 or the second sealing 4161 may be omitted.

Figure 7:
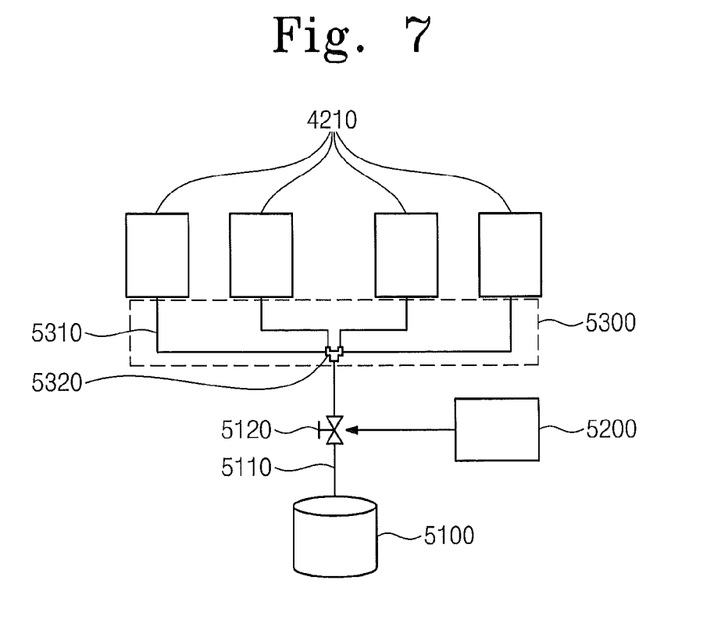
FIG. 7 is a schematic diagram illustrating a fluid distribution unit connected to a cylinder, according to exemplary embodiments of the inventive concept.

FIG. 7 is a schematic diagram illustrating a connection structure between a fluid storing member, a fluid distribution unit, and opening-and-closing members, according to exemplary embodiments of the inventive concept.

Referring to FIG. 7, a fluid storing member 5100 may be configured to supply fluid to the cylinders 4210.

The fluid storing member 5100 may be configured to store the fluid. The fluid storing member 5100 may be configured to exhaust or inhale (e.g., intake) the fluid in or with a predetermined pressure. For example, the fluid storing member 5100 may include a room, space or volume for storing the fluid and a pump for exhausting or inhaling the stored fluid in the predetermined pressure. The fluid storing member 5100 may be connected to a supply conduit 5110. The supply conduit 5110 may be provided with a valve 5120. The valve 5120 may be configured to open or close the supply conduit 5110. Further, a degree of opening the valve 5120 may be adjusted to control an amount of the fluid flowing through the supply conduit 5110. The valve 5120 may be controlled by a controller or control unit 5200. The controller 5200 may be provided in an interface manner, thereby allowing the operator to control the valve 5120 directly. Further, the controller 5200 may include a display for showing values input by the operator and the operation status of the valve 5120. In addition, the valve 5120 may be manually controlled by the operator.

Further, the controller 5200 may be omitted, and in this case, the valve 5120 may be manually controlled by an operator.

A fluid distribution unit 5300 may be provided between the fluid storing member 5100 and the cylinder 4210. The fluid distribution unit 5300 may be configured to supply a predetermined amount of the fluid to the cylinders 4210, respectively. For example, in the case where, during the process, the cylinders 4210 need the same amount of the fluid, the fluid distribution unit 5300 may be configured to supply the same amount of the fluid to each of the cylinders 4210. The fluid distribution unit 5300 may include distribution conduits 5310 and a fluid distribution member 5320.

The distribution conduits 5310 may diverge from the supply conduit 5110 and be connected to the cylinders 4210, respectively, and, in example embodiments, the number of the distribution conduits 5310 may be the same as that of the cylinders 4210. The fluid distribution member 5320 may be provided at a junction between the supply conduit 5110 and the distribution conduits 5310. The fluid distribution member 5320 may be configured to allow a predetermined amount of the fluid to be supplied from the supply conduit 5110 to the distribution conduits 5310, respectively, or to be inhaled from each of the distribution conduits 5310 to the supply conduit 5110. For example, in the case where, during the process, the cylinders 4210 need the same amount of the fluid, the fluid distribution member 5320 may distribute the fluid in such a way that the same amount of the fluid is supplied to each of the distribution conduits 5310. Further, at least two of the cylinders 4210 may be configured to have different sizes from each other. In this case, the fluid distribution member 5320 may distribute the fluid in such a way that a fraction of the fluid to be supplied to each distribution conduit 5310 has an amount suitable for the size of the corresponding one of the cylinders 4210. Further, the fluid distribution member 5320 may be configured in such a way that the fluid, whose amount corresponds to an amount of the fluid distributed from the supply conduit 5110 to the distribution conduits 5310, is flowed from the distribution conduit 5310 to the supply conduit 5110. The fluid distribution member 5320 may be configured to control (e.g., automatically control) the amount of the fluid flow without an additional control. For example, the fluid distribution member 5320 may be a flow divider that is configured to distribute a fluid according to a specific ratio.

An amount of the fluid distributed to each of the distribution conduits 5310 by the fluid distribution member 5320 may be controlled. For example, the amounts of the fluid distributed to the distribution conduits 5310 by the fluid distribution member 5320 may be modified to be different from each other instead of distributed in the same amount.

Hereinafter, the opening process of the housing 4100 will be described in more detail.

The cylinder 4210 may be operated depending on a change in pressure that is caused by the change in the amount of the supplied fluid. For example, if the pressure increases, the cylinder 4210 may be operated in such a way that the second housing 4120 is moved toward the first housing 4110 to close the housing 4100. If the pressure decreases, the cylinder 4210 may be operated in such a way that the second housing 4120 is moved away from the first housing 4110 to open the housing 4100. However, the cylinder 4210 may be configured to realize the reverse operation. For the sake of simplicity, the description that follows will refer to an example of the present embodiment in which, when the pressure increases, the cylinder 4210 is operated in such a way that the second housing 4120 is moved toward the first housing 4110, and, when the amounts of the fluids are the same, the movement distances of the cylinders 4210 are the same.

If loading of the substrate in the housing 4100 is finished, the valve 5120 may be opened. The fluid storing member 5100 may be operated to exhaust or discharge the fluid until a pressure reaches the predetermined value, at the same time as or before the opening of the valve 5120. If the valve 5120 is opened, the fluid may be supplied to the fluid distribution member 5320 via the supply conduit 5110.

The fluid distribution member 5320 may distribute the fluid to each of the distribution conduits 5310. The fluid distribution member 5320 may be operated in such a way that the fluid can be simultaneously supplied to the distribution conduits 5310. Accordingly, the cylinders 4210 can be simultaneously operated. The amount of the fluid to be supplied to each of the cylinders 4210 may be adjusted in such a way that the movement distances of the cylinders 4210 relative to the rod 4220 are the same. For example, if the cylinders 4210 have the same size, the fluids to be supplied to the cylinders 4210 may be adjusted to have the same amount. In this case, the moving distances of the cylinders 4210 may be the same, and thus, the second housing 4120 may be uniformly moved. If the second housing 4120 is uniformly moved, it is possible to prevent distortion from occurring at contact regions between the cylinder 4210 and the second housing 4120, between the second housing 4120 and the rod 4220, and/or between the rod 4220 and the first housing 4110. Accordingly, it is possible to prevent the contact regions from being broken or damaged by distortion and/or to prevent particles, which may be caused from the breaking of or damage to the contact region, from being produced.

During the process, each of the cylinders 4210 may maintain a predetermined pressure. Accordingly, it is possible to prevent the housing 4100 from being unintentionally opened by the internal pressure of the housing 4100. For example, the valve 5120 may be controlled to be closed. Alternatively, in the state that the valve 5120 is opened, the fluid storing member 5100 may be operated to apply a pressure preventing the fluid from being fluctuated.

When the process to the substrate is finished, in the state that the valve 5120 is opened, the fluid storing member 5100 may be operated to apply an inhalation or intake pressure to the supply conduit 5110. If the inhalation pressure is applied to the supply conduit 5110, the fluid may be moved to the fluid storing member 5100 to decrease the internal pressure of the cylinder 4210, and thus, the second housing 4120 may be moved away from the first housing 4110. At this time, the fluid distribution member 5320 may be operated in a reverse manner, compared with the case that the fluid is supplied to the cylinder 4210. In other words, the amounts of the fluids supplied from the distribution conduits 5310 to the supply conduit 5110 may be equivalent to those of the fluids supplied to the cylinders 4210. Accordingly, the pressures of the cylinders 4210 may be decreased in the same manner, and thus, the second housing 4120 may be moved uniformly.

Figure 8:
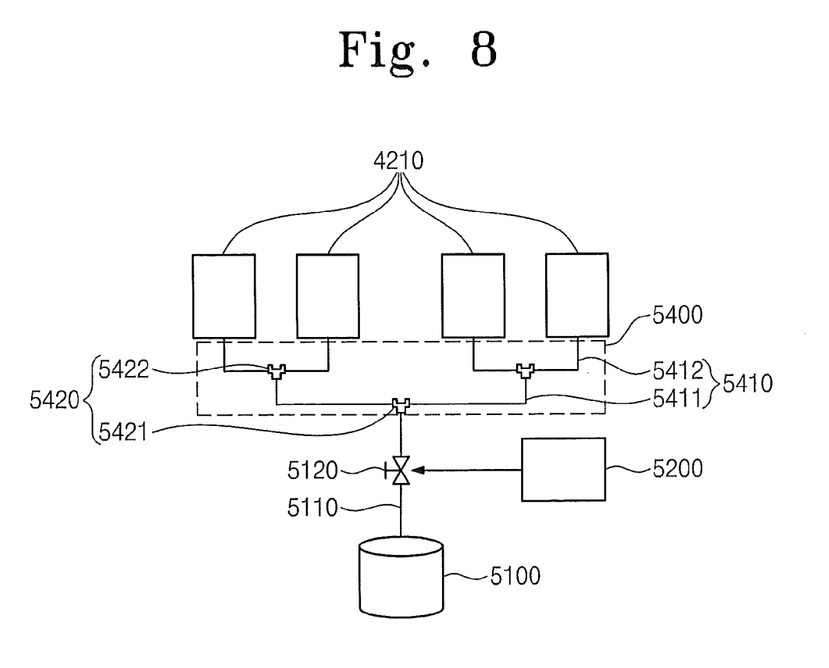
FIG. 8 is a schematic diagram illustrating a fluid distribution unit connected to a cylinder, according to other exemplary embodiments of the inventive concept.

FIG. 8 is a schematic diagram illustrating a fluid distribution unit connected to a cylinder, according to other exemplary embodiments of the inventive concept.

Referring to FIG. 8, a fluid distribution unit 5400 may include a distribution conduit 5410 and a fluid distribution member 5420.

The fluid storing member 5100, the supply conduit 5110, the valve 5120, and the controller 5200 may be configured to have substantially the same configuration and features as those of FIG. 6, and thus, for the sake of simplicity, the detailed description thereto will be omitted below.

The distribution conduit 5410 may include at least one first or primary distribution conduit 5411 and at least one second or secondary distribution conduit 5412. The first distribution conduit 5411 may diverge from the supply conduit 5110. The number of the opening-and-closing members 4200 (or cylinders 4210) may be n times the number of the first distribution conduits 5411, where n is a natural number. For example, if the number of the opening-and-closing members 4200 is four, a pair of the first distribution conduits 5411 may diverge from the supply conduit 5110. Alternatively, if the number of the opening-and-closing members 4200 is six, the number of the first distribution conduits 5411 diverging from the supply conduit 5110 may be two or three.

The second distribution conduit 5412 may diverge from an end portion of each of the first distribution conduits 5411. The number of second distribution conduits 5412 may be equal to the number of the cylinders 4210, and each of them may be connected to the corresponding one of the cylinders 4210. The number of the second distribution conduits 5412 may be the same for each of the first distribution conduits 5411. For example, if the number of the cylinders 4210 is four, a pair of the second distribution conduits 5412 may diverge from the end portion of each of the first distribution conduits 5411. Alternatively, if the number of the cylinders 4210 is six and the number of the first distribution conduits 5411 is two, the number of the second distribution conduits 5412 diverging from each of the first distribution conduits 5411 may be two or three.

The fluid distribution member 5420 may include a first or primary fluid distribution member 5421 and at least one second or secondary fluid distribution member 5422. The first fluid distribution member 5421 may be provided at a junction between the supply conduit 5110 and the first distribution conduits 5411. Each second fluid distribution member 5422 may be provided at a corresponding one of junctions between the first distribution conduits 5411 and the second distribution conduits 5412. The first fluid distribution member 5421 and the second fluid distribution member 5422 may be configured in such a way that a predetermined amount of the fluid may be supplied to or discharged from the corresponding one of the cylinders 4210. For example, if the cylinders 4210 have the same size, the first fluid distribution member 5421 may be configured in such a way that the same amount of the fluid is distributed from the supply conduit 5110 into each of the first distribution conduits 5411 or inflowed from each of the first distribution conduits 5411 into the supply conduit 5110. Additionally or alternatively, the second fluid distribution member 5422 may be configured in such a way that the same amount of the fluid is distributed from the first distribution conduit 5411 to each of the second distribution conduits 5412 or inflowed from each of the second distribution conduits 5412 to the first distribution conduit 5411.

Figure 9:
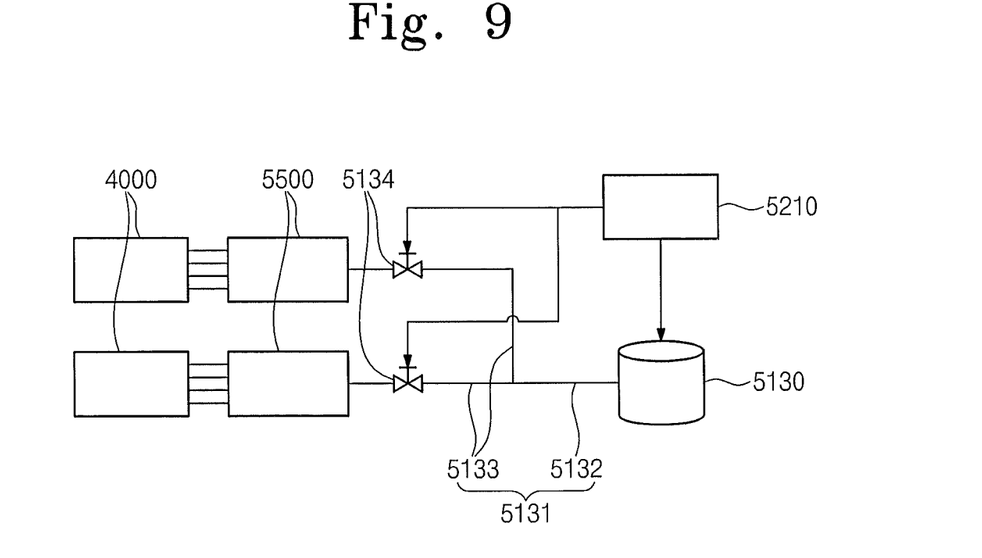
FIG. 9 is a schematic diagram illustrating a substrate treating apparatus provided with a plurality of second process chambers, according to exemplary embodiments of the inventive concept.

FIG. 9 is a schematic diagram illustrating a substrate treating apparatus provided with a plurality of second process chambers, according to exemplary embodiments of the inventive concept.

Referring to FIG. 9, a fluid storing member 5130 may be connected to a plurality of the second process chambers 4000.

Fluid distribution units 5500 may be provided between the fluid storing member 5130 and the second process chambers 4000. In example embodiments, the number of the fluid distribution units 5500 may be the same as that of the second process chambers 4000.

The fluid storing member 5130 may be connected to the fluid distribution units 5500 via the supply conduits 5131. The supply conduit 5131 may include a main conduit 5132 and branching conduits 5133. The main conduit 5132 may be connected to the fluid storing member 5130. The branching conduits 5133 may diverge from the main conduit 5132, and the number of the branching conduits 5133 may be the same as that of the second process chambers 4000 to be connected to the fluid storing member 5130. Each of the branching conduits 5133 may be provided with a valve 5134. Each of the branching conduits 5133 may be connected to the corresponding one of the fluid distribution units 5500. Each of the fluid distribution units 5500 may be connected to the corresponding one of the cylinders of the second process chambers 4000. The fluid storing member 5130, the fluid distribution unit 5500, and the cylinder of the second process chamber 4000 may be configured to have substantially the same feature as those of FIG. 6 or 7, and thus, for the sake of simplicity, the detailed description thereto will be omitted below. For example, the fluid distribution units 5500 may take the form of the fluid distribution units 5300 or 5400.

Each of the valves 5134 may be configured to open or close the corresponding one of the branching conduits 5133. Further, an opening degree of the valve 5134 may be adjusted to control an amount of the fluid flowing through the branching conduit 5133. The valves 5134 may be independently controlled by a controller or control unit 5210. The controller 5210 may be provided in an interface manner, thereby allowing the operator to control the valve 5134 directly. Further, the controller 5210 may include a display for showing values input by the operator and the operation status of the valve 5134. In addition, the valve 5134 may be manually controlled by the operator.

Figure 10:
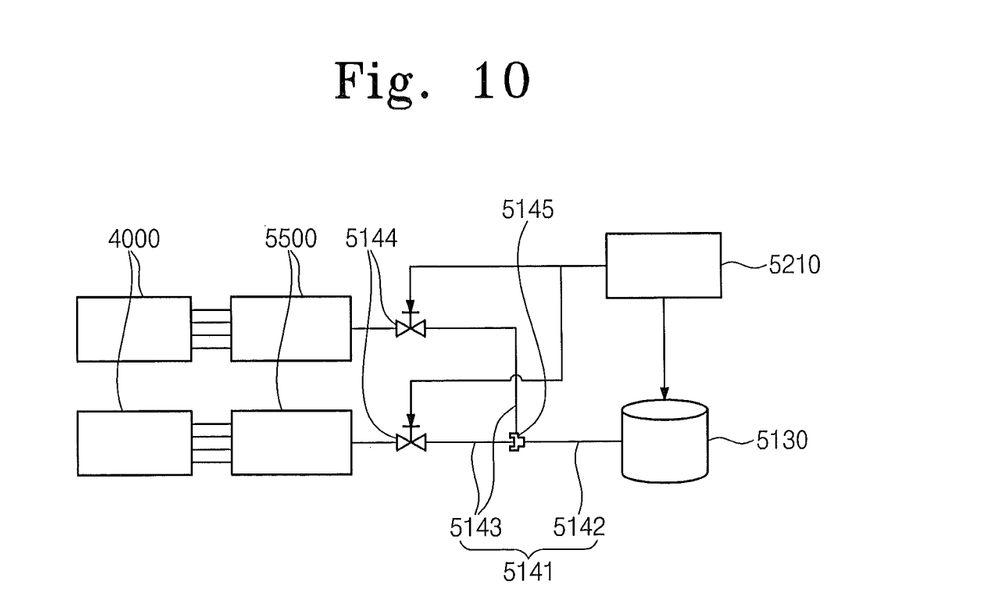
FIG. 10 is a schematic diagram illustrating a substrate treating apparatus provided with a plurality of second process chambers, according to other exemplary embodiments of the inventive concept.

FIG. 10 is a schematic diagram illustrating a substrate treating apparatus provided with a plurality of second process chambers, according to other exemplary embodiments of the inventive concept.

Referring to FIG. 10, the fluid storing member 5130 may be connected to a plurality of the second process chambers 4000.

The fluid distribution units 5500 may be provided between the fluid storing member 5130 and the second process chambers 4000. In example embodiments, the number of the fluid distribution units 5500 may be the same as that of the second process chambers 4000.

The fluid storing member 5130 may be connected to the fluid distribution units 5500 via a supply conduit 5141. The supply conduit 5141 may include a main conduit 5142 and branching conduits 5143. The main conduit 5142 may be connected to the fluid storing member 5130. The branching conduits 5143 may diverge from the main conduit 5142, and the number of the branching conduits 5143 may be the same as that of the second process chambers 4000 to be connected to the fluid storing member 5130. A fluid distribution member 5145 may be provided at a junction between the main conduit 5142 and the branching conduits 5143 to control the flow of the fluid supplied from the fluid storing member 5130 to the fluid distribution units 5500. Each of the branching conduits 5143 may be provided with a valve 5144. Each of the branching conduits 5143 may be connected to the fluid distribution unit 5500. Each of the fluid distribution units 5500 may be connected to the corresponding one of the cylinders of the second process chamber 4000. The fluid storing member 5130, the fluid distribution unit 5500, the cylinder of the second process chamber 4000, the valve 5144, and the controller 5210 may be configured to have substantially the same feature as those of FIG. 9, and thus, for the sake of simplicity, the detailed description thereto will be omitted.

According to example embodiments of the inventive concept, operations of opening and closing the chamber can be effectively controlled.

While example embodiments of the inventive concepts have been particularly shown and described, it will be understood by one of ordinary skill in the art that variations in form and detail may be made therein without departing from the spirit and scope of the attached claims.

What is claimed is:

1. A substrate treating apparatus, comprising:
   a housing;
   a plurality of opening-and-closing members configured to provide a driving force for opening and closing the housing;
   a fluid storing member configured to supply a fluid to the opening-and-closing members; and
   a fluid distribution unit connected to the fluid storing member via a supply conduit, the fluid distribution unit configured to distribute the fluid supplied from the fluid storing member to the opening-and-closing members to open and close the housing,
   wherein the fluid distribution unit comprises:
   a plurality of first distribution conduits diverging from the supply conduit, each first distribution conduit in fluid communication with at least one of the opening-and-closing members; and
   a first fluid distribution member provided at a first junction between the supply conduit and the plurality of first distribution conduits,
   wherein the first fluid distribution member is configured such that an independent predetermined amount of the fluid is distributed from the supply conduit into each first distribution conduit or received from each first distribution conduit into the supply conduit.

2. The apparatus of claim 1, wherein the first fluid distribution member is a flow divider.

3. The apparatus of claim 1, wherein each of the first distribution conduits diverge from the supply conduit at the first junction, the apparatus further comprising a plurality of second distribution conduits diverging from each first distribution conduit, wherein each second distribution conduit is connected to a corresponding one of the opening-and-closing members.

4. The apparatus of claim 3, wherein the number of the opening-and-closing members is n times the number of the first distribution conduits, where n is a natural number.

5. The apparatus of claim 4, wherein the number of the second distribution conduits diverging from each first distribution conduit is the same for each first distribution conduit.

6. The apparatus of claim 3, further comprising a plurality of second fluid distribution members, each second fluid distribution member provided at a second junction between one of the first distribution conduits and the second distribution conduits that diverge therefrom.

7. The apparatus of claim 1, wherein the housing comprises:
   a first housing; and
   a second housing configured to be movable relative to the first housing,
   wherein each of the opening-and-closing members comprises:
   a cylinder connected to an outer surface of the second housing, the cylinder configured to be driven by the fluid distributed by the fluid distribution unit; and
   a rod having a first end portion that is slidably received in the second housing and a second, opposite end portion that is connected to the first housing.

8. The apparatus of claim 7, wherein the rod is positioned such that the second end portion thereof is held in an opening formed in the first housing, wherein an end of the second end portion of the rod is exposed through an outer surface of the first housing, the apparatus further comprising a connection member connected to the end of the second end portion of the rod and the first housing.

9. The apparatus of claim 8, further comprising a sealing member provided between the rod and the first housing.

10. A substrate treating apparatus, comprising:
    a plurality of process chambers;
    a fluid storing member configured to supply a fluid that is used to provide a driving force for opening and closing the process chambers; and
    a plurality of fluid distribution units connected to the fluid storing member via a supply conduit, each fluid distribution unit connected to a corresponding one of the process chambers and configured to distribute the fluid to an opening-and-closing member of the corresponding one of the process chambers to open and close the corresponding one of the process chambers, wherein the supply conduit comprises:
- a main conduit connected to the fluid storing member; and
- a plurality of branching conduits diverging from the main conduit, each branching conduit connected to one of the fluid distribution units.

11. A substrate treating apparatus, comprising:
a housing including a first housing portion and a second housing portion, the second housing portion movable relative to the first housing portion to open and close the housing;
a plurality of cylinders connected to the second housing portion, the cylinders configured to move the second housing portion relative to the first housing portion;
a fluid storing member configured to supply a fluid to the cylinders; and
a fluid distribution unit connected to the fluid storing member via a supply conduit, the fluid distribution unit configured to distribute the fluid supplied from the fluid storing member to the cylinders such that the second housing portion moves evenly relative to the first housing portion,
wherein the fluid distribution unit comprises:
- a plurality of primary distribution conduits diverging from the supply conduit, each primary distribution conduit in fluid communication with at least one of the cylinders;
- a primary fluid distribution member provided at a first junction between the supply conduit and the plurality of primary distribution conduits;
- a plurality of secondary distribution conduits diverging from each primary distribution conduit, wherein each secondary distribution conduit is connected to a corresponding one of the cylinders; and
- a plurality of secondary fluid distribution members, each secondary fluid distribution member provided at a second junction between one of the primary distribution conduits and the secondary distribution conduits that diverge therefrom.

12. The apparatus of claim 11, further comprising a rod having a first end portion that is slidably received in the second housing portion and a second, opposite end portion that is held in an opening formed in the first housing.

13. The apparatus of claim 1, wherein the opening-and-closing members comprise a first pair of opening and closing members and a second pair of opening and closing members,
the first pair of opening and closing members including:
- a pair of first cylinders connected to the housing and driven by the fluid; and
- a pair of first rods inserted into the housing and connected to the pair of first cylinders; and
the second pair of opening and closing members including:
- a pair of second cylinders connected to the housing and driven by the fluid; and
- a pair of second rods inserted into the housing and connected to the pair of second cylinders;
wherein the pair of first rods is spaced apart from the pair of second rods by a first spacing,
wherein the first pair of opening and closing members and the second pair of opening and closing members are arranged in a rectangular pattern.

14. The apparatus of claim 13, wherein the pair of first rods includes two rods spaced apart from each other by a second spacing that is less than the first spacing, and the pair of second rods includes two rods spaced apart from each other by the second spacing.

15. The apparatus of claim 7, wherein the first housing comprises a stepped opening penetrating therethrough including:
- a cylindrical hole partially penetrating the first housing; and
- a concave hole recessed from an outer surface of the first housing to be spatially connected to the cylindrical hole, the concave hole having a width greater than that of the cylindrical hole,
wherein the second end portion of the rod protrudes over the outer surface of the first housing after passing through the stepped opening.

16. The apparatus of claim 15, further comprising:
- a fixing member received in the concave hole, the fixing member including a passageway therein aligned with the cylindrical hole such that the second end portion of the rod passes through the cylindrical hole to be inserted into the passageway of the fixing member;
- a connection member coupled to an end of the second end portion of the rod and an outer surface of the fixing member; and
- a first fixing bar inserted from an outer surface of the connection member into the second end portion of the rod such that the connection member is connected to the rod by the first fixing bar,
wherein the passageway of the fixing member and the second end portion of the rod respectively have threads that are fittingly engaged to each other.

17. The apparatus of claim 16, further comprising a second fixing bar inserted from the outer surface of the connection member into the fixing member such that the connection member is connected to the fixing member by the second fixing bar.

18. The apparatus of claim 7, further comprising for a respective opening-and-closing member:
- a cylindrical opening extending upwardly from a bottom surface of the first housing;
- a recessed portion in an upper surface of the first housing, the recessed portion extending from the cylindrical opening to the upper surface of the first housing, the recessed portion having a width greater than that of the cylindrical opening; and
- a fixing member received in the recessed portion, the fixing member including a passageway aligned with the cylindrical opening,
wherein the second end portion of the rod extends through the cylindrical opening and is fixed in the passageway of the fixing member.

19. The apparatus of claim 18, further comprising:
- a connection member coupled to an end of the second end portion of the rod and an upper surface of the fixing member; and
- a first fixing bar inserted from an upper surface of the connection member into the second end portion of the rod such that the connection member is connected to the rod by the first fixing bar,
wherein the passageway of the fixing member and the second end portion of the rod each have threads that are fittingly engaged to each other.

* * * * *